United States Patent
Petkov et al.

(10) Patent No.: US 9,462,375 B2
(45) Date of Patent: Oct. 4, 2016

(54) FEEDBACK DELAY REDUCTION IN FORCE FEEDBACK DEVICES

(71) Applicant: Robert Bosch GmbH, Stuttgart (DE)

(72) Inventors: Vladimir P. Petkov, San Jose, CA (US); Ganesh K. Balachandran, Sunnyvale, CA (US)

(73) Assignee: Robert Bosch GmbH, Stuttgart (DE)

( * ) Notice: Subject to any disclaimer, the term of this patent is extended or adjusted under 35 U.S.C. 154(b) by 127 days.

(21) Appl. No.: 14/299,346

(22) Filed: Jun. 9, 2014

(65) Prior Publication Data

US 2015/0358724 A1 Dec. 10, 2015

(51) Int. Cl.
*H04R 3/00* (2006.01)
*H03M 3/00* (2006.01)

(52) U.S. Cl.
CPC .............. *H04R 3/00* (2013.01); *H03M 3/37* (2013.01); *H03M 3/406* (2013.01); *H03M 3/422* (2013.01); *H03M 3/452* (2013.01); *H03M 3/454* (2013.01); *H04R 2201/003* (2013.01)

(58) Field of Classification Search
CPC ... H04R 3/00; H04R 2201/003; H03M 3/37; H03M 3/406; H03M 3/422; H03M 3/452; H03M 3/454
See application file for complete search history.

(56) References Cited

U.S. PATENT DOCUMENTS

| | | | | |
|---|---|---|---|---|
| 5,408,235 A | * | 4/1995 | Doyle | H03H 17/0251 341/120 |
| 6,057,794 A | * | 5/2000 | Takamuki | H03M 3/484 341/143 |
| 7,176,821 B1 | * | 2/2007 | Williams, III | H03M 7/3015 341/118 |
| 2004/0021594 A1 | * | 2/2004 | Melanson | H03M 7/3006 341/143 |
| 2014/0240156 A1 | * | 8/2014 | Ismail | G06F 3/0346 341/143 |

OTHER PUBLICATIONS

C. Lang and R. Tielert, "A low noise accelerometer with digital PID-type controller and multibit force feedback," Proceedings of the 25th European Solid-State Circuits Conference, Neuily sur Seine, France, 1999, pp. 250-253.
Gomez, U.-M., et. al., "New surface micromachined angular rate sensor for vehicle stabilizing systems in automotive applications", Transducers '05 , Jun. 2005, pp. 184-187.
D.A. Patterson and J.L. Hennessy, "Computer Organization and Design", 3rd Edition, Morgan Kaufmann Publishers, Inc., 2005 pp. 434-445.

* cited by examiner

*Primary Examiner* — Sonia Gay
(74) *Attorney, Agent, or Firm* — Maginot Moore & Beck LLP

(57) ABSTRACT

A feedback circuit provides a feedback signal to a transducer. The feedback circuit includes an ADC that generates digital representations of a feedback signal, digital controller that identifies adjustments for the feedback, and DAC that generates an analog output of the adjusted feedback signal. The digital controller performs speculative computation to identify adjustments for the feedback signal output for each output value from the ADC prior to receiving the output from the ADC. The ADC and DAC include sigma-delta modulators that operate with a zero clock cycle delay in a forward path. The ADC, digital controller, and DAC generate adjustments to the feedback output signal with reduced delay that reduce phase lag and improve phase margin to maintain stability in the transducer.

12 Claims, 7 Drawing Sheets

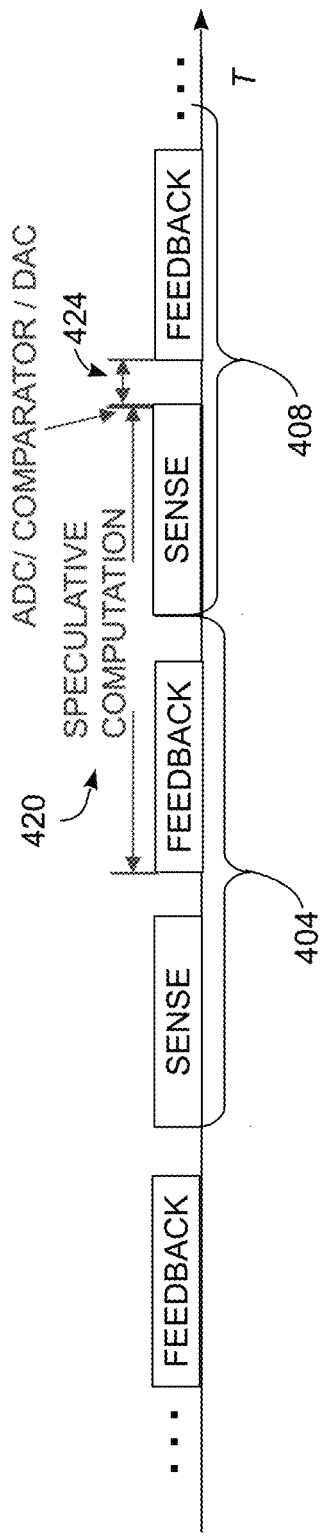
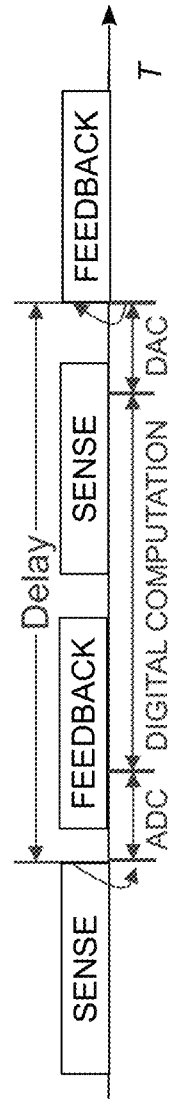
FIG. 4
FIG. 5
PRIOR ART

FEEDBACK DELAY REDUCTION IN FORCE FEEDBACK DEVICES

TECHNICAL FIELD

This disclosure relates generally to the field of electronic circuits, and, more particularly, to micro-electromechanical systems and other systems that incorporate feedback loops.

BACKGROUND

Micro-electromechanical systems (MEMS) sensors are widely used in consumer and industrial devices. Accelerometers, pressure sensors, and gyroscopes are three types of commonly deployed MEMS sensors. The small size and durability of MEMS sensors enable incorporation of these sensors into mobile electronic devices, automotive and aerospace applications, robotics, cameras, and a wide range of other electronic and electromechanical devices.

FIG. 6 depicts a prior art MEMS accelerometer 600 that includes a proof mass 604, an electronic detection and force feedback circuit 608 and force feedback electrodes 624A and 624B. During operation, a physical input force produces acceleration along the axis 532 that displaces the proof mass 604. During operation of the accelerometer 600, a force feedback circuit maintains the proof mass to a predetermined position (e.g. centered with the extension 606 equidistant between sensing electrodes 620A and 620B) when the accelerometer 600 experiences an acceleration. The force feedback from the feedback loop prevents substantial deflection of the proof mass 604 from the predetermined position, and the acceleration can be measured from changes in the level of force feedback that maintains the position of the proof mass.

The application of force feedback is known to the art to improve the linearity, gain, and dynamic range of the sensed acceleration in the accelerometer 600 since the force feedback signal ensures that deflection of the proof mass 604 only occurs over comparatively short distances and the proof mass 604 returns to the predetermined location much more quickly than would occur otherwise due to the inherent physical damping of the proof mass. The force feedback system detects small deflections in the position of the proof mass 604 as an error signal, and reduces or eliminates the error signal to maintain the position of the proof mass while the accelerometer 600 is under different levels of acceleration. In the accelerometer 600, the sensing electrodes 620A and 620B detect a differential capacitance level when the proof mass extension 606 deflects from a predetermined location in response to a physical acceleration, and the differential capacitance level acts as the error input for the feedback system. While FIG. 6 depicts a separate set of sensing electrodes 620A and 620B for illustrative purposes, in alternative embodiments the differential capacitance is measured in response to movement of the extension 607 between the feedback electrodes 624A and 624B.

During stable operation, the force feedback loop applies a force of equal magnitude and opposite direction to the proof mass 604 that cancels an external physical force that is applied to the accelerometer 600. The electronic circuit 608 includes a force feedback circuit that produces an electrical feedback signal for feedback electrodes 624A and 624B. The feedback electrodes 624A and 624B receive an electric charge that exerts a force on the proof mass 604 through an extension 607 to maintain the predetermined position of the proof mass 604 during acceleration of the sensor 600.

One issue with force feedback circuits is that the force feedback loop can become unstable, which produces an undesirable oscillation in the proof mass 604 instead of maintaining the predetermined location of the proof mass 604. FIG. 7 depicts Bode plots of gain and phase in a feedback loop in both stable and unstable regions. As is known in the art, the Bode stability criterion states that the phase shift around the force feedback loop must have a magnitude that is no more than −180° when the gain reaches unity (0 dB) for the feedback system to remain stable. To maintain stable operation in a practical circuit, the phase lag at 0 dB gain must have a magnitude that is smaller than −180° where the difference between the phase and −180° being referred to as the "phase margin." For example, a −100° phase lag has a higher value than an unstable −180° phase lag but the −100° phase lag has a smaller magnitude (absolute value) than the −180° phase lag. The −100° phase lag has a phase margin of: −100°−(−180°)=80°. In many embodiments, a digital processor in the electronic circuit 608 is configured as a compensator that adjusts the feedback signal to maintain a phase margin that enables stable operation of the MEMS sensor. The compensator includes an analog to digital converter (ADC) that produces a digital output signal corresponding to the state of the error signal for the digital processor, and the output adjustments from the digital processor are provided to a digital to analog converter (DAC) that controls the output of the feedback signal to maintain the phase margin in the force feedback loop. While FIG. 6 depicts the accelerometer 600, similar force feedback circuits are used in a wide range of other MEMS devices including, but not limited to, gyroscopic sensors, micromirrors, and other transducers.

One drawback of existing digital compensator designs is that the digital control circuits require time to measure the feedback signal and generate a corresponding adjustment to maintain the phase margin for the feedback loop. The delay between receiving the feedback signal and generating the output signal contributes to the overall "phase lag." FIG. 4 depicts phase lag in a timing diagram of a prior art digital compensator where the delay introduced by the ADC, digital computation in the digital processor, and DAC corresponds to an entire feedback and sense cycle in the accelerometer. Some prior art embodiments include even greater time delays than the delay that is depicted in FIG. 4. The phase lag due to the delay in processing the feedback signal increases the phase error in the force feedback signal. As depicted in the Bode plot of FIG. 8, the delay in the compensator increases the phase error towards the unstable −180° level at 0 dB gain, which reduces or eliminates the effectiveness of the compensator. Given the drawbacks in the existing digital compensator embodiments, improvements to the force feedback controls in MEMS sensors that improve the stability of force feedback loops would be beneficial.

SUMMARY

In one embodiment, a sigma-delta modulator circuit that operates with a zero clock cycle delay in the forward path has been developed. The sigma-delta modulator circuit includes a first summing circuit configured to generate a first plurality samples with reference to an input signal, a first delay free integrator having an input connected to an output of the first summing circuit, the first delay free integrator being configured to generate a first plurality of sums with reference to the first plurality of samples from the first summing circuit, a quantizer having an input that receives an input signal corresponding to the first plurality of sums, the quantizer being configured to generate one output signal in a predetermined plurality of output signals from an output of the quantizer with reference to the input signal, a first delay circuit having an input connected to the output of the quantizer, the first delay circuit being configured to receive an input signal corresponding to the one output signal in the plurality of predetermined output signals from the quantizer at a first time and reproduce the input signal as a feedback signal at a second time, the second time occurring after a predetermined delay from the first time, and a first gain amplifier having an input connected to an output of the first delay circuit and an output connected to another input of the first summing circuit, the gain amplifier being configured to generate an amplified feedback signal with reference to the feedback signal from the first delay circuit.

In another embodiment, a sigma-delta modulator circuit that operates with a zero clock cycle delay in the forward path has been developed. The sigma-delta modulator circuit includes a first summing circuit configured to generate a first plurality samples with reference to an input signal that is received by a first input in the first summing circuit, a first delay free integrator having an input connected to an output of the first summing circuit, the first delay free integrator being configured to generate a first plurality of sums with reference to the first plurality of samples from the first summing circuit, a first feed-forward gain amplifier having an input connected to an output of the first delay free integrator, a second delay free integrator having an input configured to receive an input signal corresponding to an output signal from the first delay free integrator, the second delay free integrator being configured to generate a second plurality of sums with reference to the input signal, a second summing circuit having a first input connected to an output of the first feed-forward gain amplifier and a second input connected to an output of the second delay free integrator, a quantizer having an input that receives an input signal from an output of the second summing circuit, the quantizer being configured to generate one output signal in a predetermined plurality of output signals from an output of the quantizer with reference to the input signal from the second summing circuit, and a first delay circuit having an input connected to the output of the quantizer, the first delay circuit being configured to receive an input signal corresponding to the one output signal in the predetermined plurality of output signals from the quantizer at a first time and reproduce the input signal as a feedback signal to an input of the first summing circuit at a second time, the second time occurring after a predetermined delay from the first time.

In another embodiment, a feedback circuit for a transducer has been developed. The feedback circuit includes a transducer, a voltage transducer having an input connected to the transducer, the voltage transducer being configured to generate a voltage signal with reference to operation of the transducer, an analog to digital converter having an input connected to an output of the voltage transducer, the analog to digital converter being configured to generate one digital output signal with reference to the voltage signal from the voltage transducer, the one digital output signal being identified from a predetermined plurality of digital output signals that the analog to digital converter is configured to generate, a digital controller having an input connected to an output of the analog to digital converter to receive the one digital output signal, a comparator circuit, and a digital processing circuit operatively connected to the comparator circuit. The digital controller is configured to identify with the digital processing circuit a plurality of feedback signal outputs with reference to each digital output signal in the plurality of predetermined digital output signals that the analog to digital converter is configured to generate prior to receiving the one digital output signal from the analog to digital converter, identify one feedback signal output in the plurality of feedback signal outputs with the comparator circuit with reference to the plurality of feedback signal outputs and the one digital output signal from the analog to digital converter after receiving the one digital output signal from the analog to digital converter, and generate a digital feedback signal corresponding to the one feedback signal output identified by the comparator circuit. The circuit further comprises a digital to analog converter having an input connected to an output of the digital controller, the digital to analog converter being configured to generate an analog feedback signal with reference to the digital feedback signal from the digital controller to provide a feedback to the transducer.

BRIEF DESCRIPTION OF THE DRAWINGS

FIG. 4 is a timing diagram of the MEMS sensor circuit of FIG. 1 that depicts speculative computation of control outputs and generation of a feedback signal with reduced delay.

FIG. 5 is a timing diagram of prior art MEMS sensor circuits that include delays for digital processing, analog to digital conversion, and digital to analog conversion of a force feedback signal.

DETAILED DESCRIPTION

For the purposes of promoting an understanding of the principles of the embodiments described herein, reference is made to the drawings and descriptions in the following written specification. No limitation to the scope of the subject matter is intended by the references. The description also includes any alterations and modifications to the illustrated embodiments and includes further applications of the principles of the described embodiments as would normally occur to one skilled in the art to which this document pertains.

As used herein, the term "transducer" refers to any device that converts one type of input signal to another type of output signal. Many MEMS sensor transducers convert a mechanical force, such as linear or rotational acceleration, to some form of electrical force such as a change in capacitance, resistance, current flow, voltage, charge, or the like. For example, in a MEMS accelerometer a movement of the proof mass generates a differential capacitance between two plates that transduces physical movement into a differential capacitance. In other MEMS devices, the transducer receives an electrical input signal that is converted to a mechanical force, such as in a MEMS micro-mirror device or MEMS actuator. Transducers are also used in electrical circuits to convert between different electrical properties, such as converting electrical capacitance, current, resistance, or charge into a voltage signal.

As used herein, the term "MEMS sensor element" refers to a form of transducer in a MEMS device that includes a structure having a proof mass that moves along at least one axis of motion during operation of the device. The proof mass is a member that moves in a relative reference frame in response to external forces, such as a linear or rotational forces, that produce an acceleration of the MEMS device. As described below, a digital control device is configured to generate force feedback signals to control the position of the proof mass during operation of the MEMS device. The digital control device embodiments described herein generate the feedback signals with reduced phase delay and improved phase margin compared to prior art embodiments.

Figure 1:
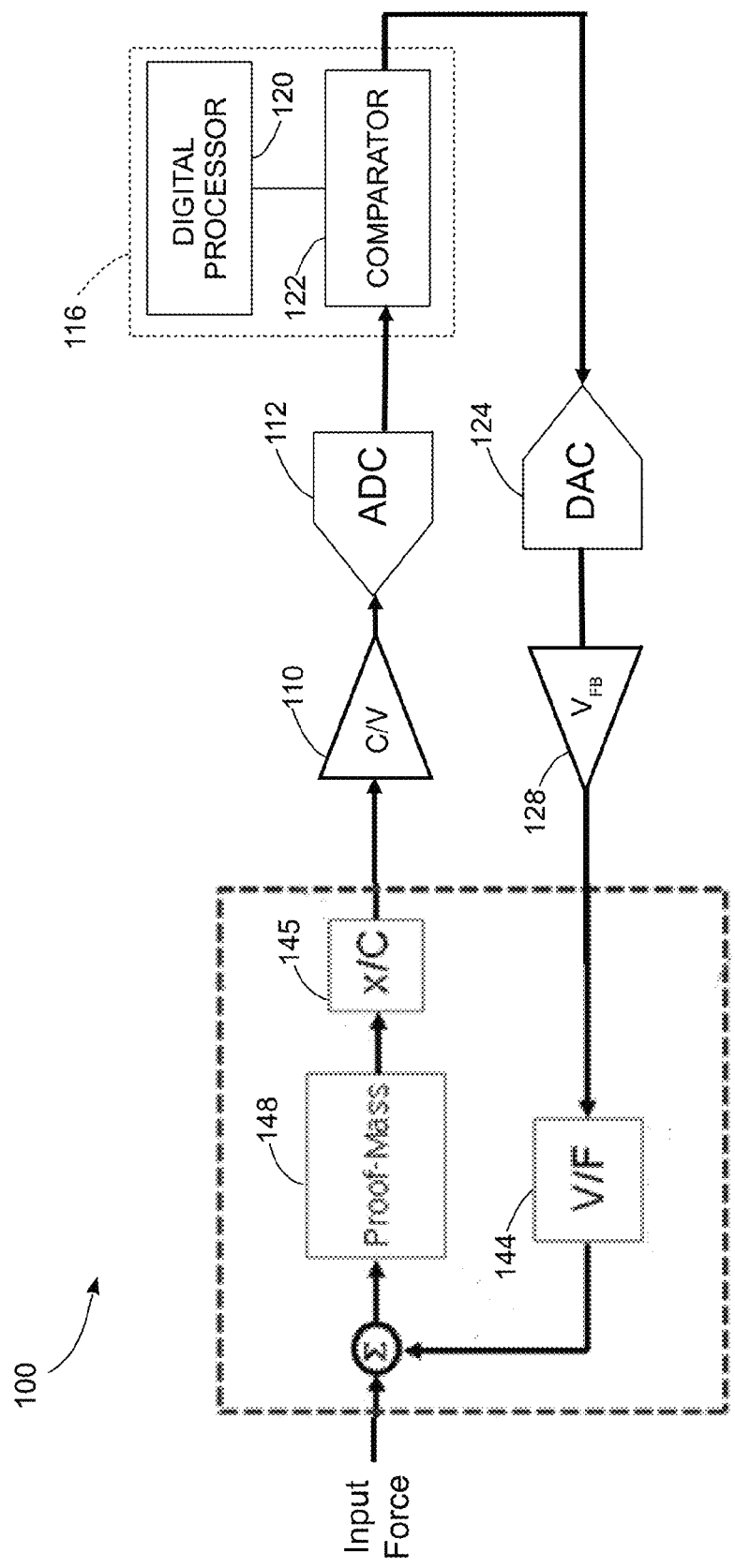
FIG. 1 is a diagram of a MEMS sensor circuit with digital force feedback control that operates with reduced phase lag to improve stability of the force feedback loop.

FIG. 1 is a block diagram of a MEMS sensor circuit 100 that is configured to operate with force feedback and a digital compensator circuit that operates with a reduced delay between receiving a feedback input signal to generation of the feedback output signal. The reduction in delay for adjusting the feedback signal reduces the phase lag, which increases the phase margin of the feedback signal and stability of operation in the MEMs sensor circuit 100. The circuit 100 includes an electromechanical transducer 108, capacitance to voltage converter (C/V) 110, analog to digital converter (ADC) 112, digital controller 116, digital to analog converter (DAC) 124, and voltage buffer 128.

In the MEMS sensor circuit 100, the transducer 108 includes a proof mass 148, feedback electrodes 144 and sense electrodes 145. The feedback electrodes 144 are connected to outputs of the voltage buffer 128 to receive a force feedback signal. The sense electrodes are connected to the C/V converter 110. The transducer 108 is, for example, an accelerometer MEMS sensor element where the proof mass 148 deflects from a predetermined position in response to an acceleration. In alternative embodiments, the transducer 108 is a MEMS sensor element in a gyroscope, micro-mirror, or other suitable MEMS device.

During operation, the C/V 110 generates a voltage signal corresponding to a measured differential capacitance between the proof mass 148 and one or both of the sense electrodes, which are either embodied as the feedback electrodes 144 or as a separate set of electrodes, such as the sense electrodes 145 in FIG. 1. As used herein, the term "voltage transducer" refers to a device that produces a voltage output signal with reference to an electrical property of another device, such as the differential capacitance in the MEMS transducer 108, and the C/V converter 110 is one example of a voltage transducer. In one embodiment, the C/V 110 measures a differential capacitance between the proof mass 148 and each of the electrodes 144. When the proof mass 148 is centered between the electrodes 144, the differential capacitance is at or near zero and the magnitude of the capacitance differential increases when the proof mass 148 deflects towards one of the electrodes 144 and away from the other electrode. The magnitude of the voltage signal from the C/V 110 indicates the distance of deflection for the proof mass 148, and the sign of the voltage signal indicates the direction of the deflection along the axis between the feedback electrodes 144. Thus, the output voltage signal from the C/V 110 is an analog signal that corresponds to an error input signal to the force feedback circuit 100.

The output of the C/V 110 is connected to an input of the ADC 112 that converts the analog voltage signal from the C/V 110 to a digital output that is suitable for input to the digital controller 116. The ADC 112 in the embodiment of FIG. 1 is a one-bit ADC that is configured to sample the voltage output from the C/V 110 at two or more times the maximum frequency of interest for the output of the C/V 110. In one embodiment that is described in more detail below, the ADC 112 includes a configuration that generates a digital output signal that corresponds to the C/V output 110 with a zero clock cycle delay compared to prior art ADC circuits that include a delay of one or more clock cycles. While FIG. 1 depicts a capacitance to voltage converter 110, alternative sensor embodiments include different forms of voltage transducer based on electrical and mechanical characteristics of different transducers, including MEMS and non-MEMS transducers. For example, in devices a resistance to voltage converter is used in piezoresistive sensor. A Hall effect sensor is an example of a transducer that converts a magnetic field, which typically fluctuates in response to movement of physical magnets past a coil or other sensor element, to a voltage signal. Hall effect sensors are used in some mechanical or electromechanical feedback systems to monitor the movement of a physical element that receives a physical feedback signal. In other embodiments, a charge to voltage converter is used to generate a voltage with reference to a charge produced by a transducer such as a piezoelectric transducer or photo diode that reacts to light.

The digital controller 116 includes an input that receives the digital output signal from the ADC 112 and an output that generates a one-bit digital control signal for the DAC 124. The digital controller 116 is embodied as a digital microprocessor, microcontroller, field programmable gate array (FPGA), application specific integrated circuit (ASIC), or any other suitable digital logic device. In the embodiment of FIG. 1, the digital controller 116 includes two functional units with a digital processor 120 and a comparator 122. In some embodiments the digital controller 116 implements programmable digital logic that executes program instructions that are stored in a memory to implement the functions of the digital processor 120 and comparator 122.

During operation of the circuit 100, the digital processor 120 in the digital controller 116 performs a control process to adjust the output of the force feedback signal. Examples of control processes that the digital processor 120 performs during operation include, but are not limited to, proportional-integral (PI) and proportional-integral-derivative (PID) control processes. In some embodiments, the digital processor 120 incorporates a memory that stores a history of a previously-detected input data from the ADC 112 and previously generated output signals, and the history data are used as part of generating control output in addition to the present-time input data from the ADC 112. During the speculative computation process, the digital processor 120 identifies one or more force feedback output signals, such as two or more force feedback output voltage levels, that should be generated in response to any of the potential digital input signals from the ADC 112. The digital processor 120 identifies digital output values (e.g. a binary 0 or 1) that correspond to the different feedback signal outputs for each of the potential ADC input values.

As with prior-art digital processors, the digital processor 120 performs computations to identify a digital output value that is used to control the force feedback signal in a manner that maintains the predetermined location of the proof mass in the transducer 108 while also performing compensation to maintain the phase margin in the feedback signal and stability in the sensor 100. However, the digital processor 120 performs the computations in a speculative manner so that the results of the computations are produced prior to the generation of a corresponding input signal from the ADC 112.

FIG. 4 depicts the speculative computation in the context of a timing diagram. FIG. 4 depicts an illustrative example of two sense-feedback cycles 404 and 408 that occur during operation of the circuit 100. Each of the cycles includes a sense phase where the circuit 100 measures an output from a MEMS sensor element, which includes measuring deflection that corresponds to an acceleration that the transducer 108 experiences in the example of FIG. 1. During the feedback phase, the circuit 100 applies the force feedback signal to the transducer 108 to maintain the proof mass 148 in the predetermined location when the transducer 108 experiences acceleration. As depicted in FIG. 4, during a first cycle 404, the digital processor 120 performs speculative computation of an output signal. The computation is speculative because the digital processor 120 is not performing the control process based on the input from the ADC 112 during the cycle 404, but instead the digital processor 120 performs the control process based on every potential input value that can come from the ADC 112 during the next cycle 408. In the embodiment of the circuit 100, the ADC 112 is a one-bit ADC that generates two output values, so the processor 120 performs the speculative processing to identify output values for both of the potential input values from the ADC 112 that may occur during the subsequent cycle 408. In other embodiments that use a multi-bit ADC, the processor 120 performs the speculative computation for each of the potential input values from the ADC. As depicted in the time period 420 of FIG. 4, the processor 120 has the entire length of time from the commencement of the generation of the feedback signal in the cycle 404 until approximately the termination of the sensing process in the cycle 408 to perform the speculative computation. The reduction in delay that is depicted in FIG. 4 reduces the phase lag of the force feedback signal, which increases the phase margin and enables stable operation of the MEMS sensor circuit 100.

In FIG. 4, the time period 424 corresponds to a comparatively short gap in time between the sense phase and the feedback phase of the cycle 408. During the time period 424, the ADC 112 generates a digital output, the digital controller 116 generates a digital control signal using the comparator 122, and the DAC 124 generates an analog output signal to apply voltage to the feedback electrodes 144 through the voltage buffer 128 with reference to the digital output from the digital controller 116. The processing of the ADC 112, digital processor 116, and DAC 124 each generate some delay. As described below, the comparator 122 introduces a much shorter time delay than is required for identification of the output value in the prior art timing diagram of FIG. 5. Additionally, in some embodiments described below the ADC 112 and DAC 124 are configured to generate digital and analog outputs, respectively, with zero clock cycle delay compared to prior art ADC and DAC embodiments that include delays of one or more clock cycles.

During the time period 424, the ADC 112 generates the binary digital value (0 or 1) corresponding to the present-time output of the CN 110, the comparator 122 generates a digital output control signal, and the DAC 124 receives the digital control signal and generates an analog control signal for the feedback electrodes 144 through the voltage buffer 128. The comparator 122 receives the input value and performs a simple comparison based on the previously identified results from the digital processor 120. The digital processor 120 identifies digital values (e.g. 0 or 1) that correspond to feedback output signal for each of the two potential input values (e.g. 0 or 1) and the comparator 122 generates the previously identified output value with reference to the input from the ADC 112. Using pseudo-code examples, the processor 120 generates one of the following four configurations, or logical equivalents thereof, for the comparator 122 to generate the feedback signal during each feedback cycle in the circuit 100:

Configuration A: if ADC_input==1 then Output=1; else Output=0;
Configuration B: if ADC_input==1 then Output=0; else Output=1;
Configuration C: Output=1; //output 1 for any value of ADC_input
Configuration D: Output=0; //output 0 for any value of ADC_input Referring again to FIG. 1, the DAC 124 includes an input that is connected to an output of the digital controller 116. The DAC 124 is a one-bit DAC that generates an analog feedback output signal for the feedback electrodes 144 through the voltage buffer 128 with reference to the digital value from the digital controller 116. In the configuration of FIG. 1, the DAC 124 generates a+1 V or −1V feedback output signal with reference to the digital output from the digital controller 116. The voltage buffer 128 receives the analog output feedback signal from the DAC 124 and generates the feedback voltage for the feedback electrodes 144. The feedback electrodes 144 apply a feedback force in response to the voltage signal in conjunction with physical input forces that are applied to the transducer 108 to maintain the location of the proof mass 148 in the predetermined location in the transducer 108.

While the circuit 100 is embodied as a force feedback circuit that is used with the MEMS accelerometer transducer 108 for illustrative purposes, the speculative computation and zero clock cycle delay ADC/DAC circuits that are described above can be used to increase the phase margin in a wide range of feedback loops. Other MEMS devices including gyroscopes and micro mirror devices can employ the feedback loop described above. In addition to the MEMS transducers described above, other transducers and electronic or electromechanical devices that operate with feedback including, but not limited to, photo diode sensors can be incorporated within reduced delay feedback loops that are similar to the feedback loop in the circuit 100.

Figure 2:
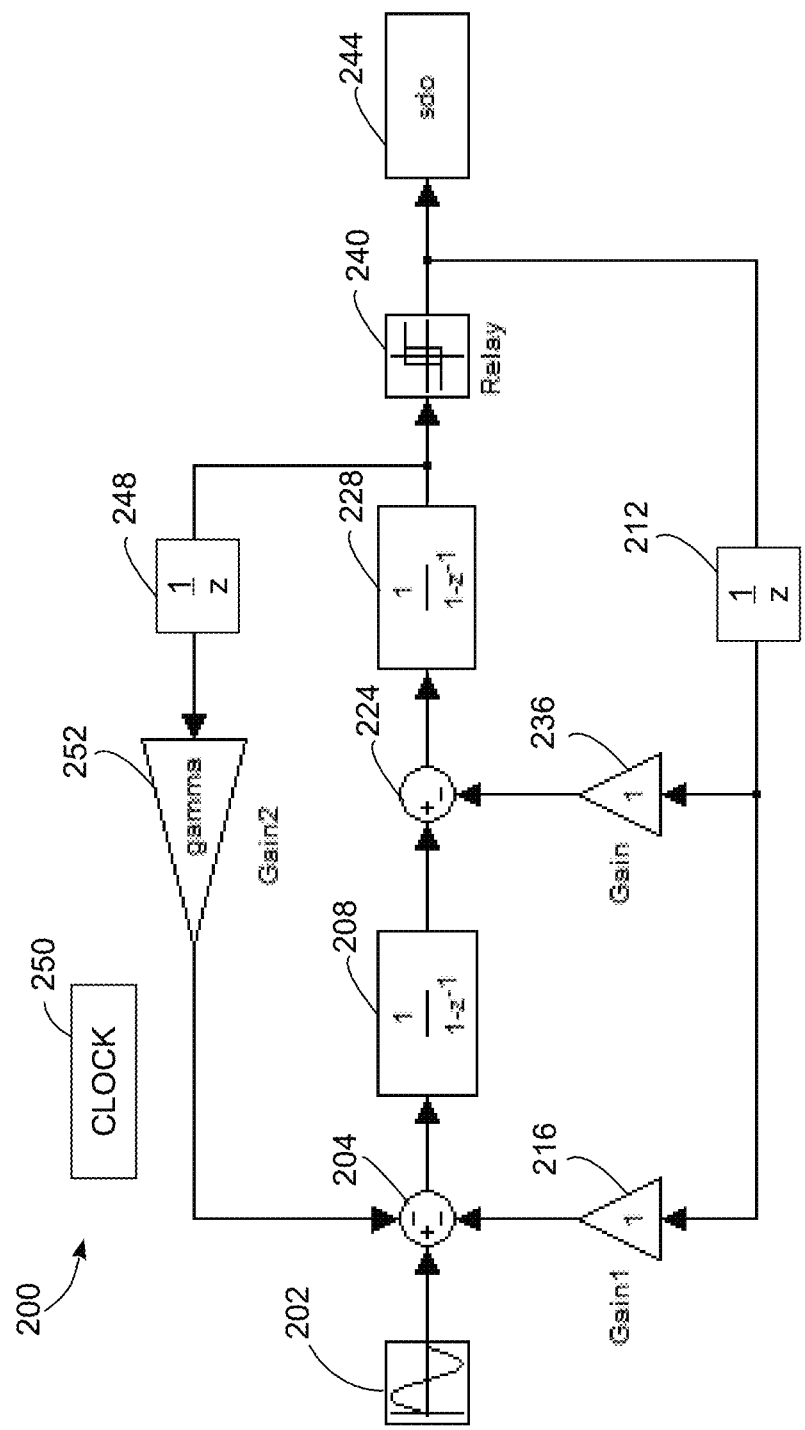
FIG. 2 is a schematic diagram of a sigma-delta modulator that includes a forward path with a zero clock cycle delay and is used in an analog to digital converter or digital to analog converter.

FIG. 2 is a schematic diagram of a circuit configuration of a sigma-delta modulator (SDM) circuit 200 that is used in one or both of the ADC 112 and DAC 124 in the MEMS sensor circuit 100. The sigma delta modulator 200 operates with a zero clock cycle forward-path delay to reduce the overall delay between receiving the feedback signal input and generating the feedback signal output in the circuit 100.

The SDM circuit 200 includes a first summing circuit 204, first zero-delay integrator 208, first feedback delay element 212, first feedback gain amplifier 216, second summing circuit 224, second zero-delay integrator 228, quantizer 240, and output 244. The SDM circuit 200 includes synchronous components that operate at a predetermined frequency with reference to a clock signal that is generated by a clock source 250. The predetermined frequency of operation controls the rate at which the SDM circuit 200 samples input signals. The first summing circuit 204 includes one input that receives the input signal 202 and another input that is connected to an output of the gain amplifier 216 to receive a feedback signal. The summing circuit 204 generates a sum of the input signal 202 and feedback signal from the gain amplifier 216 through an output that is connected to an input of the first zero-delay integrator 208. The SDM 200 is configured with a negative feedback loop where the summing circuit 204 generates a summed output that corresponds to the sum of the input signal 202 and the negative feedback signal. The zero-delay integrator 208 generates an integrated output corresponding to two or more output sums from the summing circuit 204 with a transfer function of $$\frac{1}{1-z^{-1}}.$$

The integrator 208 is referred to as a "zero delay" integrator because the integrator 208 generates the integrated output without any additional delay that is introduced through a buffer, latch, or other suitable device to delay generation of the integrator output for one or more cycles of the clock signal.

The SDM circuit 200 is configured as a second-order SDM in which the second summing circuit 224 includes an input that is connected to the output of the first zero-delay integrator 208 and an input that is connected to an output of the second gain amplifier 236. The output of the second summing circuit 224 is connected to an input of the second zero-delay integrator 228. The second zero-delay integrator includes the same transfer function $$\frac{1}{1-z^{-1}}$$

as the first zero-delay integrator 208. The output of the second zero-delay integrator 228 is connected to an input of the quantizer 240 to control the output of the quantizer 240 to the output terminal 244. In a one-bit ADC configuration, the output signal corresponds to a one-bit digital output with binary output levels (e.g. logical 0 or 1), while in a one-bit DAC configuration the output signal corresponds to two distinct analog outputs based on a digital input (e.g. +1V or −1V). In alternative embodiments, the quantizer 240 is a multi-bit quantizer that produces a predetermined plurality of output signals with reference to the input from an integrator, such as the integrator 208 in a first-order SDM circuit, integrator 228 in the second-order SDM circuit 200 of FIG. 2, or another integrator in a higher-order SDM circuit. In many embodiments, a quantizer 240 that generates the predetermined output signals with a power of two number of output levels, such as a plurality of two ($2^1$), four ($2^2$), eight ($2^3$), sixteen ($2^4$), etc. output levels.

The SDM circuit 200 includes a forward path and two feedback paths. The forward path runs from the input 202 to the output 244 including the first summation circuit 204, first zero-delay integrator 208, second summation circuit 224, second zero-delay integrator 228, and quantizer 240. The first feedback path 212 includes the first delay circuit 212, first gain amplifier 216, and second gain amplifier 236. The delay circuit 212 includes an input that is connected to the output of the quantizer 240 with a transfer function of 1/z that stores an output value from the quantizer 240 at a first time and reproduces the value through an output of the delay circuit 212 for the inputs of the gain amplifiers 216 and 236 at a second time after a delay of one or more clock cycles from the clock source 250.

As is known in the art, discrete-time feedback circuits require at least one delay element in each feedback loop in order to be physically implementable to provide proper feedback. The delay circuit 212 ensures implementability by generating the feedback signal in the first feedback path of the SDM circuit 200 based on a previously generated output signal from the SDM circuit 200 instead of the present-time output signal. However, the forward path does not include any delay circuits, which enables the output terminal 244 to generate an output corresponding to the input signal 202 within a time period of one cycle of the clock 250. Of course, the generation of the output signal at the output terminal 244 with reference to the input signal 202 is not instantaneous, but the SDM circuit 200 is configured so that the delay circuits are placed in the feedback paths instead of the forward paths to enable the SDM circuit 200 to operate with a zero clock cycle delay in the generation of the output signal with reference to the input signal. The zero clock cycle delay in the SDM circuit 200 refers to the fact that the quantizer 240 generates an output corresponding to the input signal 250 that is received during the present-time clock cycle of the circuit 200 instead of generating an output that corresponds to an earlier input from a previous clock cycle. Reducing the delay in generation of an output signal with the SDM circuit 200 in ADCs and DACs that incorporate the circuit 200 enables the circuit 100 to generate the force feedback signal with reduced phase lag, which increases the phase margin in the force feedback loop to enable stable operation of the circuit 100.

In the embodiment of FIG. 2, the SDM circuit 200 includes a second feedback path that includes a second delay circuit 248 and another feedback gain amplifier 252. The second delay circuit 248 operates in the same manner as the delay circuit 212 but the delay circuit 248 includes an input that is connected to the output of the second zero-delay integrator 228 instead of the output of the quantizer circuit 240. The feedback gain amplifier 252 generates additional gain that is supplied to an input of the first summing circuit 204. The second feedback path enables the SDM circuit 200 to operate with a notch in the quantization noise in a narrow frequency band away from DC (0 Hz). The sigma-delta modulator that includes the second feedback path is referred to a "bandpass" modulator, where the second feedback path is a resonator in the bandpass modulator. The bandpass modulator is useful for circuits where the signal of interest is in a narrow frequency range that is higher than DC. A MEMS gyroscope is an example of such a device, where the signal of interest is in a narrow frequency band around a higher frequency (e.g. +/−80 Hz around 25 kHz). The second feedback path depicted in the circuit 200 is not required for the SDM circuits that are employed as ADCs and DACs for some types of MEMS devices such as accelerometers where the frequency of interest is at or near DC (0 Hz).

As described above, the SDM circuit 200 is configured as a second-order SDM, although alternative embodiments are configured using only the first stage with the first summing circuit 204, first zero-delay integrator 208, and first feedback gain amplifier 216 in conjunction with the first feedback delay element 212. Still other embodiments incorporate additional summing circuits, zero-delay integrators, and gain amplifiers to implement the SDM circuit with a higher order that includes three or more stages.

In the illustrative configuration of FIG. 2, the SDM circuit 200 is configured as a one-bit ADC that receives the analog input signal 202 and generates the output signal 244 as a series of two different output signal levels ($2^1$) that correspond to logical 0 and 1 values. The ADC 112 of FIG. 1 uses the SDM circuit 200 to reduce the forward path delay in generating the digital output signal. The DAC 124 of FIG. 1 also uses the SDM circuit 200 in another configuration to generate an analog output at two different output levels (e.g. +/−1V) to control the operation of the voltage buffer 128 for generation of the force feedback signal in the mechanical transducer 108. As described above, alternative embodiments of the SDM circuit 200 are configured with a quantizer that outputs a higher number of N bits that produce $2^N$ distinct predetermined output values. The SDM circuit 200 typically operates at a frequency of at least twice the highest frequency component of interest in the input signal 202 to generate a digital output signal that corresponds to the input signal.

Figure 3A:
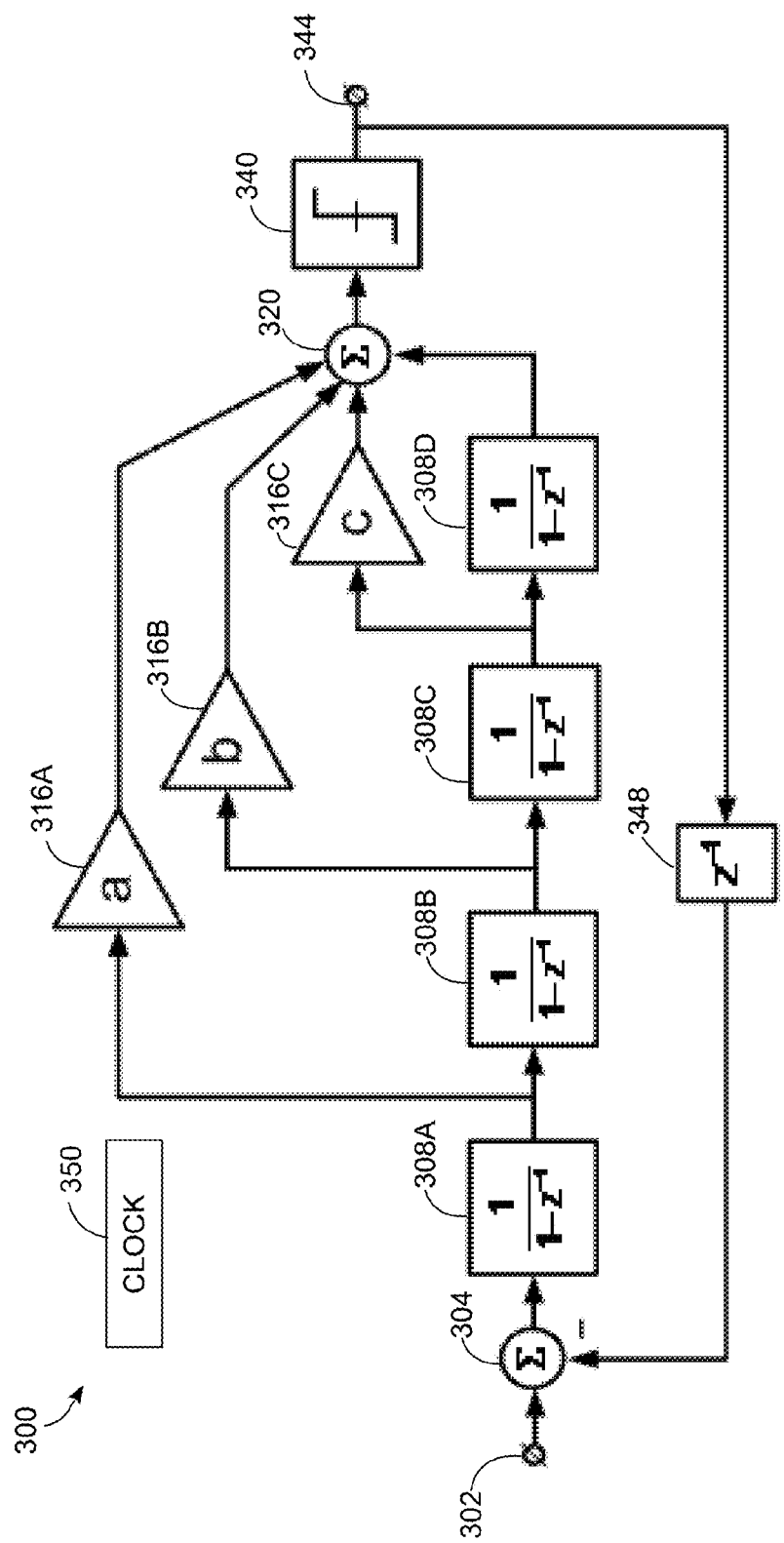
FIG. 3A is a schematic diagram of another sigma-delta modulator that includes feed-forward paths to operate with a zero clock cycle delay in generation of an output signal and is used in an analog to digital converter or digital to analog converter.

FIG. 3A depicts another embodiment of an SDM circuit 300 that operates with a zero clock cycle delay in a forward path. The SDM circuit 300 includes a first summation circuit 304, delay free integrators 308A-308D, feed-forward amplifiers 316A-316C, a second summing circuit 320, quantizer 340, and feedback path including a delay circuit 348. The components in the SDM circuit 300 include synchronous devices that operate with reference to a clock signal from a clock signal generator 350. The SDM circuit 300 is an illustrative embodiment of a fourth-order SDM that includes the four integrators 308A-308D, and a single negative feedback path from an output 344 of the quantizer 340 through the delay circuit 348 to an input of the first summing circuit 304.

In the illustrative embodiment of FIG. 3A the delay free integrators 308A-308D each operate with the transfer function of $$\frac{1}{1-z^{-1}}$$

that is also the transfer function of the delay free integrators in the circuit 200. In one portion of the forward path in the circuit 300, the output of the delay free integrator 308A is connected to the input of the delay free integrator 308B, the output of the delay free integrator 308B is connected to the input of the delay free integrator 308C, and the output of the delay free integrator 308C is connected to the input of the delay free integrator 308D. The output of the integrator 308D is connected directly to an input of the summing circuit 320 without a separate feed-forward amplifier.

The SDM circuit 300 includes three feed-forward paths including the output of the integrator 308A through the feed-forward gain amplifier 316A, the output of the integrator 308B through the feed-forward gain amplifier 316B, and the output of the integrator 316C through the feed-forward gain amplifier 316C. The summing circuit 320 receives the inputs from the feed-forward amplifiers 316A-316C and the output of the delay free integrator 308D to generate an input for the quantizer 340 that includes a sum of the delay-free outputs corresponding to each of the integrators 308A-308D. The feed-forward paths in the SDM circuit 300 provide stability due to the fact that the feedback path in the SDM circuit only provides feedback to the input of the first stage at the first summing circuit 304. As is known in the art, each of the zero delay integrators introduces a 90° phase lag. In the circuit 200, the feedback signal is distributed to each stage in the SDM circuit to compensate for the phase lag, but in the SDM circuit 300 the feedback signal is not provided to each of the stages. The feed-forward amplifiers 316A-316C provide the feed forward signal that provides additional stability when combined with output of the integrator 308D to generate the input signal for the quantizer 340.

The quantizer 340 in the SDM circuit 300 operates in a similar manner to the quantizer 240 in the SDM circuit 200. In one embodiment the quantizer 340 is a one-bit quantizer that produces one output signal from two predetermined output signals with reference to the inputs from the gain amplifiers 316A-316C and integrator 308D, while in other embodiments the quantizer 340 is a multi-bit quantizer that produces one output signal in a predetermined plurality of output signals (e.g. $2^N$ predetermined outputs in an N-bit configuration).

In the SDM circuit 300, the forward path from the input 302 to the quantizer output 344 is implemented with a zero clock cycle delay in a similar manner to the SDM circuit 200. The delay circuit 348 in the feedback path includes buffers, latches, or other suitable components to reproduce the output signal from the quantizer 340 to the input of the summing circuit 304 after a delay of one cycle from the clock generator 350. The delay circuit 348 in the feedback path enables the SDM circuit 360 to be physically implementable while providing output with a zero clock cycle delay.

The SDM circuit 300 is implemented as a fourth-order SDM for illustrative purposes, but alternative embodiments are configured as lower-order or higher-order SDMs. For example, a second-order SDM includes the delay free integrator 308A, feed-forward amplifier 316A, and an input of the delay free integrator 308D connected to the output of the integrator 308A. A third-order SDM includes the integrator 308A and feed-forward amplifier 316A, integrator 308B and feed-forward amplifier 316B, and integrator 308D connected to the output of the integrator 308B. Higher-order SDMs include additional integrators and feed-forward amplifiers that extend the configuration of the circuit 300 that is depicted in FIG. 3A.

Figure 3B:
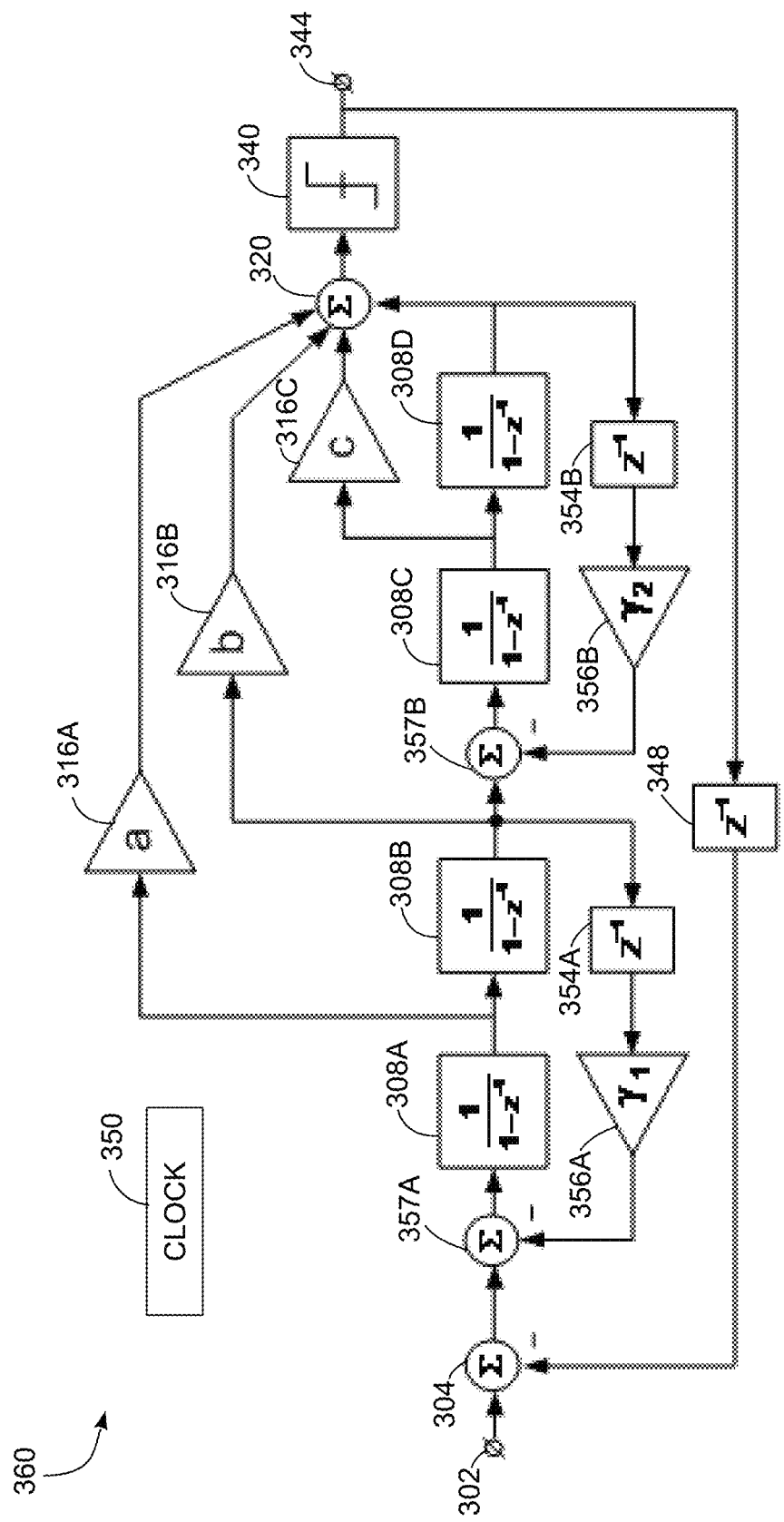
FIG. 3B is a schematic diagram of another configuration of the sigma-delta modulator of FIG. 3A that includes resonator feedback paths.
Figure 6:
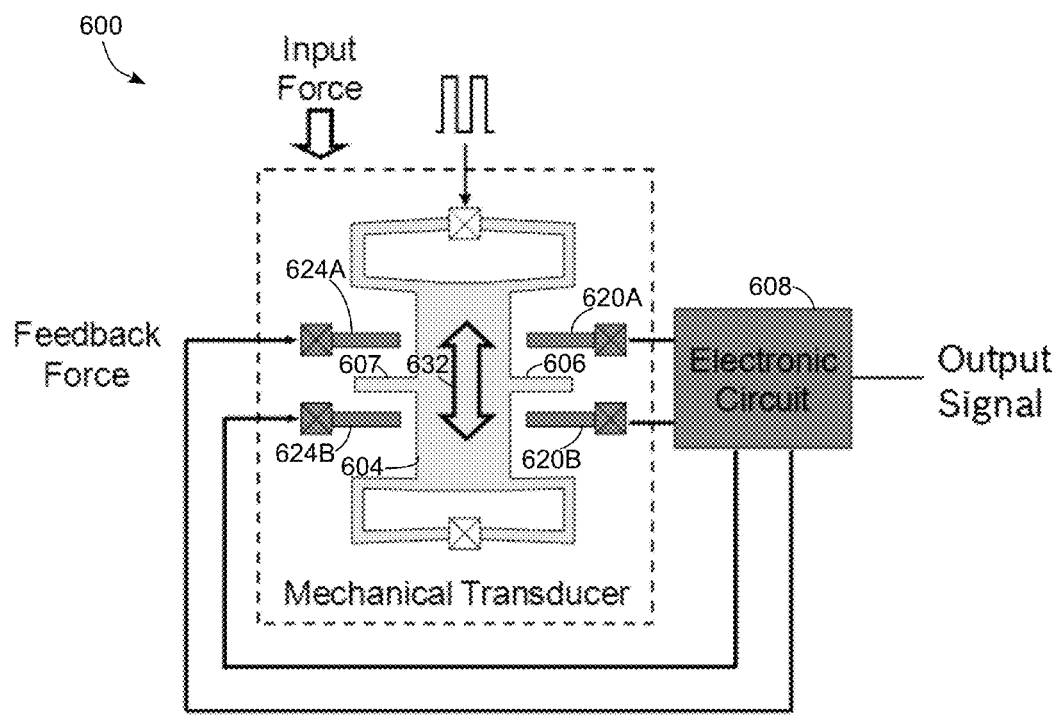
FIG. 6 is a diagram of a prior art MEMS sensor.
Figure 7:
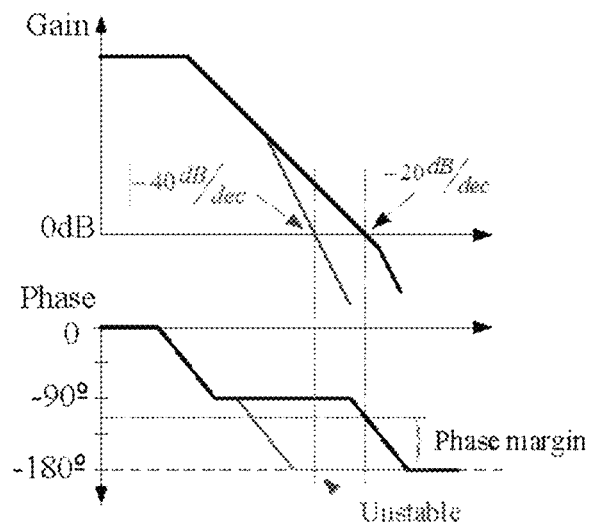
FIG. 7 is a frequency response plot of a prior art force feedback loop that becomes unstable when the phase of the signal is −180° at 0 dB gain.
Figure 8:
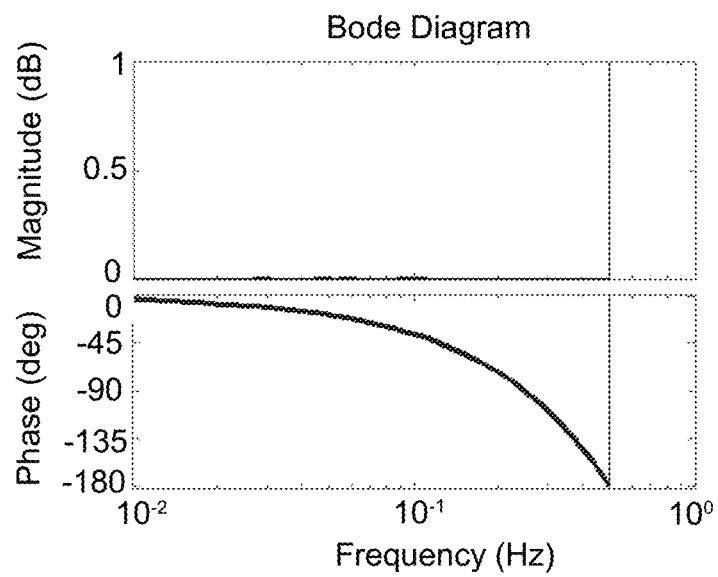
FIG. 8 is a Bode plot that depicts phase lag in a discrete time signal that is produced from a delay of one clock cycle in a prior art feedback circuit.

FIG. 3B depicts another SDM circuit 360. The SDM circuit 360 in FIG. 3B is configured as a fourth-order SDM with feed-forward paths that is similar to the SDM circuit 300. The SDM circuit 360 also includes two resonators as depicted by the intermediate feedback paths from the output of the delay free integrator 308B through a delay circuit 354A, gain amplifier 356A, and an input of an intermediate summing circuit 357A that includes another input connected to the summing circuit 304 and an output that is connected to the input of the delay free integrator 308A. The SDM circuit 360 includes another resonator along a feedback path from the output of the delay free integrator 308D through a delay circuit 354B, gain amplifier 356B, and an input of an intermediate summing circuit 357B that includes another input connected to the output of the delay free integrator 308B and an output that is connected to the input of the delay free integrator 308A. While FIG. 3B depicts the summing circuits 304 and 357A as distinct two-input summing circuits for illustrative purposes, the summing circuits 304 and 357A are equivalent to a single summing circuit with three inputs and a single output that is connected to the input of the integrator 308A.

As with the feedback path between the quantizer output 344 and the first summing circuit 304, the delay circuits 354A and 354B generate a delay of one clock cycle from receiving an input signal until producing the input signal as an output to enable the feedback loops to be physically implementable while enabling the forward path in the SDM circuit to operate with zero clock cycle delay. The two resonators that are depicted in FIG. 3B enable filtering of quantization noise around two different frequencies. For example, in one embodiment the quantization noise can be filtered around the frequency of oscillation f for a MEMS gyroscopic sensor and at a second harmonic 2f of the frequency of oscillation.

It will be appreciated that variants of the above-described and other features and functions, or alternatives thereof, may be desirably combined into many other different systems, applications or methods. For example, one configuration of the circuit 100 uses the digital controller 116 that performs the speculative computation of the feedback signal control process in conjunction with a prior art ADC, prior art DAC, or prior art ADC and DAC. In another configuration of the circuit 100, one or both of the ADC and DAC incorporate the SDM circuits 200, 300, and 360 of FIG. 2, FIG. 3A, and FIG. 3B, respectively, to reduce the phase lag while operating with a prior art digital processor. Various presently unforeseen or unanticipated alternatives, modifications, variations or improvements may be subsequently made by those skilled in the art that are also intended to be encompassed by the following claims.

What is claimed:

1. A feedback circuit comprising:
   a transducer;
   a voltage transducer having an input connected to the transducer, the voltage transducer being configured to generate a voltage signal with reference to operation of the transducer;
   an analog to digital converter having an input connected to an output of the voltage transducer, the analog to digital converter being configured to generate one digital output signal with reference to the voltage signal from the voltage transducer, the one digital output signal being identified from a predetermined plurality of digital output signals that the analog to digital converter is configured to generate;
   a digital controller having an input connected to an output of the analog to digital converter to receive the one digital output signal, a comparator circuit, and a digital processing circuit operatively connected to the comparator circuit, the digital controller being configured to:
      identify with the digital processing circuit a plurality of feedback signal outputs with reference to each digital output signal in the plurality of predetermined digital output signals that the analog to digital converter is configured to generate prior to receiving the one digital output signal from the analog to digital converter;
      identify one feedback signal output in the plurality of feedback signal outputs with the comparator circuit with reference to the plurality of feedback signal outputs and the one digital output signal from the analog to digital converter after receiving the one digital output signal from the analog to digital converter; and
      generate a digital feedback signal corresponding to the one feedback signal output identified by the comparator circuit; and
   a digital to analog converter having an input connected to an output of the digital controller, the digital to analog converter being configured to generate an analog feedback signal with reference to the digital feedback signal from the digital controller to provide feedback to the transducer.

2. The feedback circuit of claim 1 wherein the analog to digital converter is a one-bit analog to digital converter that is configured to generate the one digital output signal identified from two predetermined digital output values, the digital controller is configured to generate the digital feedback signal corresponding to one feedback signal output identified from two predetermined feedback signal outputs, and the digital to analog converter is a one-bit digital to analog converter configured to generate the analog feedback signal at one analog voltage level identified from two predetermined analog feedback signal outputs with reference to the digital feedback signal.

3. The feedback circuit of claim 1, the analog to digital converter further comprising:
   a first summing circuit configured to generate a first plurality samples with reference to the voltage signal from the voltage converter;
   a first delay free integrator having an input connected to an output of the first summing circuit, the first delay free integrator being configured to generate a first plurality of sums with reference to the first plurality of samples from the first summing circuit;
   a quantizer having an input that receives an input signal corresponding to the first plurality of sums, the quantizer being configured to generate one output signal in a predetermined plurality of output signals from an output of the quantizer with reference to the input signal, the output of the quantizer being connected to the input of the digital controller;
   a first delay circuit having an input connected to the output of the quantizer, the first delay circuit being configured to receive an input signal corresponding to the one output signal in the predetermined plurality of output signals from the quantizer at a first time and reproduce the input signal as a feedback signal at a second time, the second time occurring after a predetermined delay from the first time; and
   a first gain amplifier having an input connected to an output of the first delay circuit and an output connected to another input of the first summing circuit, the gain amplifier being configured to generate an amplified feedback signal with reference to the feedback signal from the first delay circuit.

4. The feedback circuit of claim 3, the analog to digital converter further comprising:
   a second summing circuit having an input connected to an output of the first delay free integrator, the second summing circuit being configured to generate a second plurality of samples with reference to the first plurality of sums;
   a second delay free integrator having an input connected to an output of the second summing circuit and an output connected to the input of the quantizer, the second delay free integrator being configured to generate a second plurality of sums with reference to the second plurality of samples from the second summing circuit and the quantizer being configured to generate the one output signal in the predetermined plurality of output signals with reference to the second plurality of sums; and
   a second gain amplifier having an input connected to the output of the first delay circuit and an output connected to an input of the second summing circuit, the second gain amplifier being configured to generate an amplified feedback signal for the second summing circuit with reference to the feedback signal from the first delay circuit.

5. The feedback circuit of claim 4, the analog to digital converter further comprising:
   a second delay circuit having an input connected to the output of the second delay free integrator, the second delay circuit being configured to receive an input signal with reference to the second plurality of sums from the second delay free integrator at the first time and reproduce the input signal as another feedback signal at the second time, the second time occurring after the predetermined delay from the first time; and
   a third gain amplifier having an input connected to an output of the second delay circuit and an output connected to another input of the first summing circuit, the third amplifier being configured to generate another amplified feedback signal for the first summing circuit with reference to the other feedback signal from the second delay circuit.

6. The feedback circuit of claim 1, the digital to analog converter further comprising:
   a first summing circuit configured to generate a first plurality samples with reference to the digital feedback signal from the digital controller;
   a first delay free integrator having an input connected to an output of the first summing circuit, the first delay free integrator being configured to generate a first plurality of sums with reference to the first plurality of samples from the first summing circuit;
   a quantizer having an input that receives an input signal corresponding to the first plurality of sums, the quantizer being configured to generate one output signal in a predetermined plurality of output signals from an output of the quantizer with reference to the input signal, the output of the quantizer being connected to the input of the digital controller;
   a first delay circuit having an input connected to the output of the quantizer, the first delay circuit being configured to receive an input signal corresponding to the one output signal in the predetermined plurality of output signals from the quantizer at a first time and reproduce the input signal as a feedback signal at a second time, the second time occurring after a predetermined delay from the first time; and
   a first gain amplifier having an input connected to an output of the first delay circuit and an output connected to another input of the first summing circuit, the gain amplifier being configured to generate an amplified feedback signal with reference to the feedback signal from the first delay circuit.

7. The feedback circuit of claim 6, the digital to analog converter further comprising:
   a second summing circuit having an input connected to an output of the first delay free integrator, the second summing circuit being configured to generate a second plurality of samples with reference to the first plurality of sums;
   a second delay free integrator having an input connected to an output of the second summing circuit and an output connected to the input of the quantizer, the second delay free integrator being configured to generate a second plurality of sums with reference to the second plurality of samples from the second summing circuit and the quantizer being configured to generate the one output signal in the predetermined plurality of output signals with reference to the second plurality of sums; and
   a second gain amplifier having an input connected to the output of the first delay circuit and an output connected to an input of the second summing circuit, the second gain amplifier being configured to generate an amplified feedback signal for the second summing circuit with reference to the feedback signal from the first delay circuit.

8. The feedback circuit of claim 7, the digital to analog converter further comprising:
   a second delay circuit having an input connected to the output of the second delay free integrator, the second delay circuit being configured to receive an input signal with reference to the second plurality of sums from the second delay free integrator at the first time and reproduce the input signal as another feedback signal at the second time, the second time occurring after the predetermined delay from the first time; and
   a third gain amplifier having an input connected to an output of the second delay circuit and an output connected to another input of the first summing circuit, the third amplifier being configured to generate another amplified feedback signal for the first summing circuit with reference to the other feedback signal from the second delay circuit.

9. The feedback circuit of claim 1, the analog to digital converter further comprising:
   a first summing circuit configured to generate a first plurality samples with reference to an input signal that is received by a first input in the first summing circuit;
   a first delay free integrator having an input connected to an output of the first summing circuit, the first delay free integrator being configured to generate a first plurality of sums with reference to the first plurality of samples from the first summing circuit;
   a first feed-forward gain amplifier having an input connected to an output of the first delay free integrator;
   a second delay free integrator having an input configured to receive an input signal corresponding to an output signal from the first delay free integrator, the second delay free integrator being configured to generate a second plurality of sums with reference to the input signal;
   a second summing circuit having a first input connected to an output of the first feed-forward gain amplifier and a second input connected to an output of the second delay free integrator;
   a quantizer having an input that receives an input signal from an output of the second summing circuit, the quantizer being configured to generate one output signal in a predetermined plurality of output signals from an output of the quantizer with reference to the input signal from the second summing circuit; and
   a first delay circuit having an input connected to the output of the quantizer, the first delay circuit being configured to receive an input signal corresponding to the one output signal in the predetermined plurality of output signals from the quantizer at a first time and reproduce the input signal as a feedback signal to an input of the first summing circuit at a second time, the second time occurring after a predetermined delay from the first time.

10. The feedback circuit of claim 1, the digital to analog converter further comprising:

a first summing circuit configured to generate a first plurality samples with reference to an input signal that is received by a first input in the first summing circuit;

a first delay free integrator having an input connected to an output of the first summing circuit, the first delay free integrator being configured to generate a first plurality of sums with reference to the first plurality of samples from the first summing circuit;

a first feed-forward gain amplifier having an input connected to an output of the first delay free integrator;

a second delay free integrator having an input configured to receive an input signal corresponding to an output signal from the first delay free integrator, the second delay free integrator being configured to generate a second plurality of sums with reference to the input signal;

a second summing circuit having a first input connected to an output of the first feed-forward gain amplifier and a second input connected to an output of the second delay free integrator;

a quantizer having an input that receives an input signal from an output of the second summing circuit, the quantizer being configured to generate one output signal in a predetermined plurality of output signals from an output of the quantizer with reference to the input signal from the second summing circuit; and a first delay circuit having an input connected to the output of the quantizer, the first delay circuit being configured to receive an input signal corresponding to the one output signal in the predetermined plurality of output signals from the quantizer at a first time and reproduce the input signal as a feedback signal to an input of the first summing circuit at a second time, the second time occurring after a predetermined delay from the first time.

11. The feedback circuit of claim 1 wherein the transducer is a micro-electromechanical system sensor element.

12. The feedback circuit of claim 11 wherein the voltage transducer is a capacitance to voltage converter.

* * * * *